(12) United States Patent
Onishi et al.

(10) Patent No.: US 8,664,765 B2
(45) Date of Patent: Mar. 4, 2014

(54) SEMICONDUCTOR DEVICE

(75) Inventors: Kazunaga Onishi, Matsumoto (JP); Yoshikazu Takamiya, Matsumoto (JP); Takaaki Funakoshi, Matsumoto (JP); Yoshihiro Kodaira, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/638,955

(22) PCT Filed: Sep. 8, 2011

(86) PCT No.: PCT/JP2011/070472
§ 371 (c)(1),
(2), (4) Date: Oct. 2, 2012

(87) PCT Pub. No.: WO2012/073572
PCT Pub. Date: Jun. 7, 2012

(65) Prior Publication Data
US 2013/0020725 A1   Jan. 24, 2013

(30) Foreign Application Priority Data
Dec. 3, 2010   (JP) .................................. 2010-270080

(51) Int. Cl.
*H01L 23/48*   (2006.01)

(52) U.S. Cl.
USPC ..... 257/758; 257/773; 257/774; 257/E21.507

(58) Field of Classification Search
USPC .......... 257/741, 750, 758, 773, 784, E21.507, 257/E23.024; 438/618–622
See application file for complete search history.

(56) References Cited

FOREIGN PATENT DOCUMENTS

| | | |
|---|---|---|
| JP | 09-074165 A | 3/1997 |
| JP | 2000-286289 A | 10/2000 |
| JP | 2002-353270 A | 12/2002 |
| JP | 2009-158787 A | 7/2009 |
| JP | 2010-103222 A | 5/2010 |

OTHER PUBLICATIONS

International Search Report issued Dec. 6, 2011 for PCT/JP2011/070472.

*Primary Examiner* — Dung A. Le
(74) *Attorney, Agent, or Firm* — Rossi, Kimms & McDowell LLP

(57) ABSTRACT

A semiconductor device includes a substrate, an insulating substrate mounted on the substrate, a metal pattern formed on the insulating substrate, an electronic part mounted on the metal pattern across a bond, and a wire member, separate from a wiring wire, which contains a material repellent to the bond and is formed on the metal pattern and around the electronic part.

11 Claims, 17 Drawing Sheets

| | BONDING PITCH | NUMBER OF SEMICONDUCTOR DEVICES LOADED | NUMBER OF OCCURRENCES | RATE OF OCCURRENCE |
|---|---|---|---|---|
| WIRE MEMBER ABSENT | — | 79 | 79 | 100% |
| WIRE MEMBER PRESENT | 6mm | 43 | 3 | 6% |
| | 3mm | 1290 | 0 | 0% |

SEMICONDUCTOR DEVICE

This application is a U.S. National Phase Application of PCT International Application PCT/JP2011/070472 filed on Sep. 8, 2011 which is based on and claims priority from JP 2010-270080 filed on Dec. 3, 2010 the contents of which is incorporated in its entirety by reference.

TECHNICAL FIELD

The present invention relates to a semiconductor device for which a bond is used, and a method of manufacturing the semiconductor device.

BACKGROUND ART

There is a semiconductor device wherein an electronic part is mounted across solder on a metal layer formed on an insulating substrate. With the semiconductor device, when mounting the electronic part on the metal layer across the solder, the solder flows toward the perimeter, and it may happen, for example, that the solder spreads as far as an edge of the metal layer, or that the solder spreads as far as a position in which another electronic part mounted on the metal layer is disposed.

When the solder spreads as far as an edge of the metal layer, high stress is applied to an insulating substrate in the vicinity of the edge of the metal layer when heat is applied, and there is a possibility of a crack occurring. Also, when the solder spreads as far as the position in which the other electronic part is disposed, there is a possibility of it affecting a junction of the other electronic part.

In response to this, in order to suppress the spreading of the solder, it is conceivable, for example, that a solder-repellent insulating film is formed on the metal layer around a position in which the electronic part is mounted, or that a slit is formed in the metal layer around the position in which the electronic part is mounted.

There exists, for example, a power semiconductor device wherein a power semiconductor element is joined by solder onto a metal pattern mounted on one principal surface of a heat sink across an insulating layer, and the metal pattern is separated by a solder mask into a power semiconductor element formation region and a wire relay region (for example, refer to Patent Document 1).

Also, there exists, for example, a multi-chip module substrate, which has a solder sealing region in which a sealing cover is soldered to a surface of an insulating material, wherein a metal layer is provided inside or outside the solder sealing region, and a zonal region of constant width in which there is no metal layer is formed into a closed loop in a boundary division between the solder sealing region and metal layer (for example, refer to Patent Document 2).

RELATED ART DOCUMENTS

Patent Documents

Patent Document 1: JP-A-2009-158787
Patent Document 2: JP-A-9-74165

DISCLOSURE OF THE INVENTION

Problems to be Solved by the Invention

However, with the method of forming a solder-repellent insulating film on the metal layer around the position in which the electronic part is mounted, a step for forming an insulating film is newly necessary, and there is a possibility of manufacturing cost increasing. Also, a gas is generated by the thermal decomposition of organics in a temperature region exceeding 280° C. to 300° C., and (1) the mask is liable to become detached, meaning that it is difficult to assemble. (2) An impurity concentration in the atmosphere is high, and it is difficult to assemble.

Also, with the method of forming a slit in the metal layer around the position in which the electronic part is mounted, when the metal layer forms an electric signal path, the inductance of the metal layer changes due to the slit provided in the metal layer, and there is a possibility of it affecting the electrical characteristics of the semiconductor device. Because of this, it may happen that it is not possible to form a slit in the metal layer.

These problems, not being limited to when solder is used, may also occur in the same way when another bond is used.

Bearing in mind this kind of point, the invention has an object of providing a semiconductor device which is improved in reliability while curbing manufacturing cost, and a method of manufacturing the semiconductor device.

Means for Solving the Problems

In order to achieve the heretofore described object, there are provided the following semiconductor device and semiconductor device manufacturing method.

The semiconductor device includes a substrate; an insulating substrate mounted on the substrate; a metal layer formed on the insulating substrate; an electronic part mounted on the metal layer across a bond; and a wire member, separate from a wiring wire, which contains a material repellent to the bond and is formed on the metal layer and around the electronic part.

Also, the semiconductor device manufacturing method includes a step of forming a wire member, separate from a wiring wire, which contains a material repellent to a bond, on a metal layer which is formed on an insulating substrate mounted on a substrate and includes an electronic part mounting region, and around the electronic part mounting region; and a step of, after forming the wire member, mounting an electronic part on the metal layer across the bond in such a way as to cover the electronic part mounting region.

Advantage of the Invention

According to the disclosed semiconductor device and semiconductor device manufacturing method, it is possible to improve reliability while curbing manufacturing cost.

The heretofore described and other objects, features, and advantages of the invention will be clarified by the following descriptions relating to the attached drawings illustrating preferred embodiments as examples of the invention.

BRIEF DESCRIPTION OF THE DRAWINGS

FIG. 9 is a diagram showing test results in Reference Example 3.

MODE FOR CARRYING OUT THE INVENTION

Figure 1:
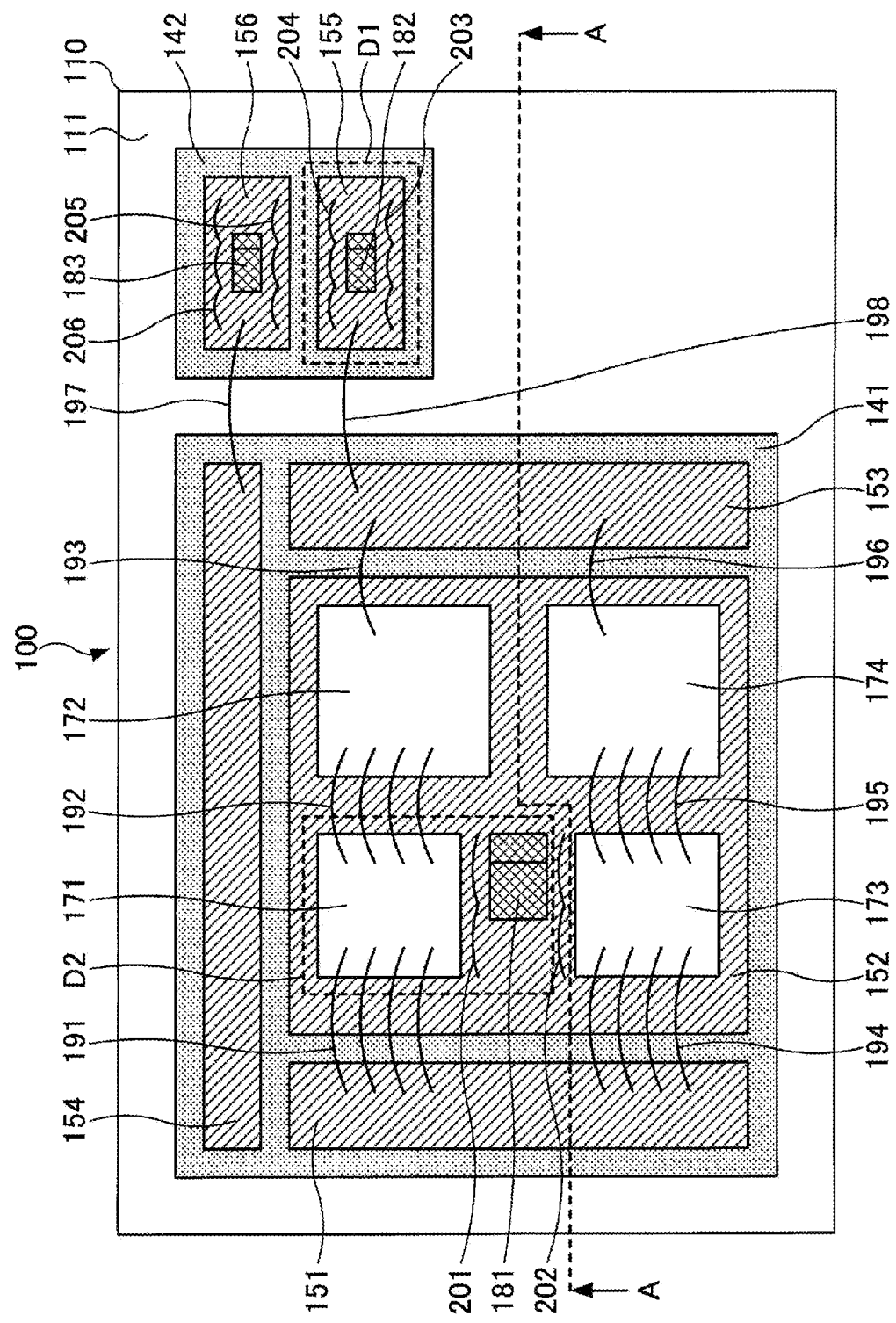
FIG. 1 is a top view showing an example of a semiconductor device according to a first embodiment.

Hereafter, a description will be given, referring to the drawings, of embodiments.

First Embodiment

Figure 2:
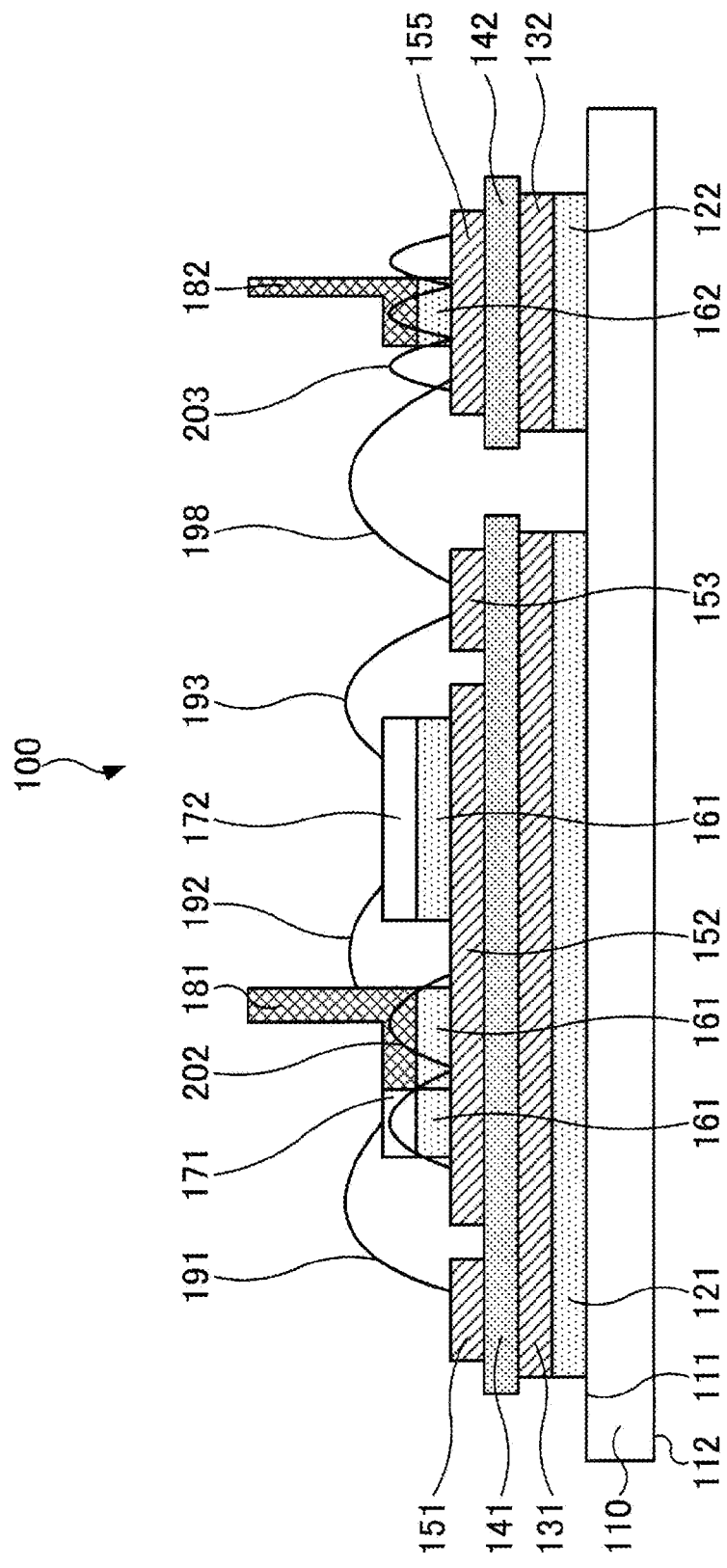
FIG. 2 is a sectional view showing the example of the semiconductor device according to the first embodiment.

FIG. 1 is a top view showing an example of a semiconductor device according to a first embodiment. FIG. 2 is a sectional view showing the example of the semiconductor device according to the first embodiment. Herein, FIG. 2 corresponds to a sectional view along a dashed line A-A of FIG. 1.

A semiconductor device 100 has a substrate 110 including a front surface 111 and a rear surface 112. For example, a metallic plate is used for the substrate 110. Specifically, as a material of the substrate 110, for example, copper, a copper alloy such as Cu—Mo (a copper-molybdenum alloy), or AlSiC (aluminum silicon carbide) is used. Also, for example, heat dissipating fins (not shown) are provided on the rear surface 112 of the substrate 110.

Metal patterns 131 and 132 are formed across bonds 121 and 122 respectively on the front surface 111 of the substrate 110. For example, solder is used for the bonds 121 and 122. As a material of the metal patterns 131 and 132, for example, copper or aluminum is used. In the case of aluminum, processing such as Ni plating is carried out so as to enable a solder joint.

An insulating substrate 141 is formed on the metal pattern 131. An insulating substrate 142 is formed on the metal pattern 132. As a material of the insulating substrates 141 and 142, for example, a ceramic based on aluminum nitride, silicon nitride, or alumina is used.

Metal patterns 151, 152, 153, and 154 are formed on the insulating substrate 141. Metal patterns 155 and 156 are formed on the insulating substrate 142. As a material of the metal patterns 151 to 156, for example, copper is used.

Semiconductor elements 171, 172, 173, and 174 and an external connection terminal 181 are mounted on the metal pattern 152 across bonds 161. The external connection terminal 181 is disposed between the semiconductor element 171 and semiconductor element 173.

An external connection terminal 182 is mounted on the metal pattern 155 across a bond 162. An external connection terminal 183 is mounted on the metal pattern 156 across the bond 162.

For example, solder is used for the bonds 161 and 162. As a material of the external connection terminals 181 to 183, for example, copper, brass, or phosphor bronze is used. For example, an insulated gate bipolar transistor (IGBT) or a free wheeling diode (FWD) is used for the semiconductor elements 171 to 174.

The semiconductor element 171 and metal pattern 151 are electrically connected by plural wiring bonding wires 191. The semiconductor element 171 and semiconductor element 172 are electrically connected by plural wiring bonding wires 192. The semiconductor element 172 and metal pattern 153 are electrically connected by a wiring bonding wire 193.

The semiconductor element 173 and metal pattern 151 are electrically connected by plural wiring bonding wires 194. The semiconductor element 173 and semiconductor element 174 are electrically connected by plural wiring bonding wires 195. The semiconductor element 174 and metal pattern 153 are electrically connected by a wiring bonding wire 196.

The metal pattern 154 and metal pattern 156 are electrically connected by a wiring bonding wire 197. The metal pattern 153 and metal pattern 155 are electrically connected by a wiring bonding wire 198. As a material of the wiring bonding wires 191 to 198, for example, aluminum, copper, or gold is used.

Furthermore, a wire member 201 is formed between the external connection terminal 181 and semiconductor element 171, and a wire member 202 is formed between the external connection terminal 181 and semiconductor element 173, on the metal pattern 152.

Also, wire members 203 and 204 are formed on the metal pattern 155, one between the external connection terminal 182 and either edge of the metal pattern 155. Wire members 205 and 206 are formed on the metal pattern 156, one between the external connection terminal 183 and either edge of the metal pattern 156.

A material repellent to the bonds 161 is used for the wire members 201 and 202, and a material repellent to the bond 162 is used for the wire members 203 to 206. Being repellent to a bond means having low reactivity with the bond. That is, a material poor in wettability with the bonds 161 is used for the wire members 201 and 202, and a material poor in wettability with the bond 162 is used for the wire members 203 to 206.

For example, a material the same as that of the wiring bonding wires 191 to 198 is used for the wire members 201 to 206. Specifically, aluminum is used as a material of the wire members 201 to 206. Aluminum has solder repellency. That is, aluminum is poor in wettability with solder.

Also, the wire members 201 to 206 are provided separately from wiring bonding wires such as the wiring bonding wires 191 to 198. That is, the wire members 201 and 202 are not joined to the metal patterns 151 and 153 to 156, other than the metal pattern 152, or to the semiconductor elements 171 to 174. The wire members 203 and 204 are not joined to the metal patterns 151 to 154 and 156, other than the metal pattern 155, or to the semiconductor elements 171 to 174. The wire members 205 and 206 are not joined to the metal patterns 151 to 155, other than the metal pattern 156, or to the semiconductor elements 171 to 174.

The heretofore described semiconductor elements 171 to 174 and external connection terminals 181 to 183 may each be referred to simply as an electronic part.

Figure 3:
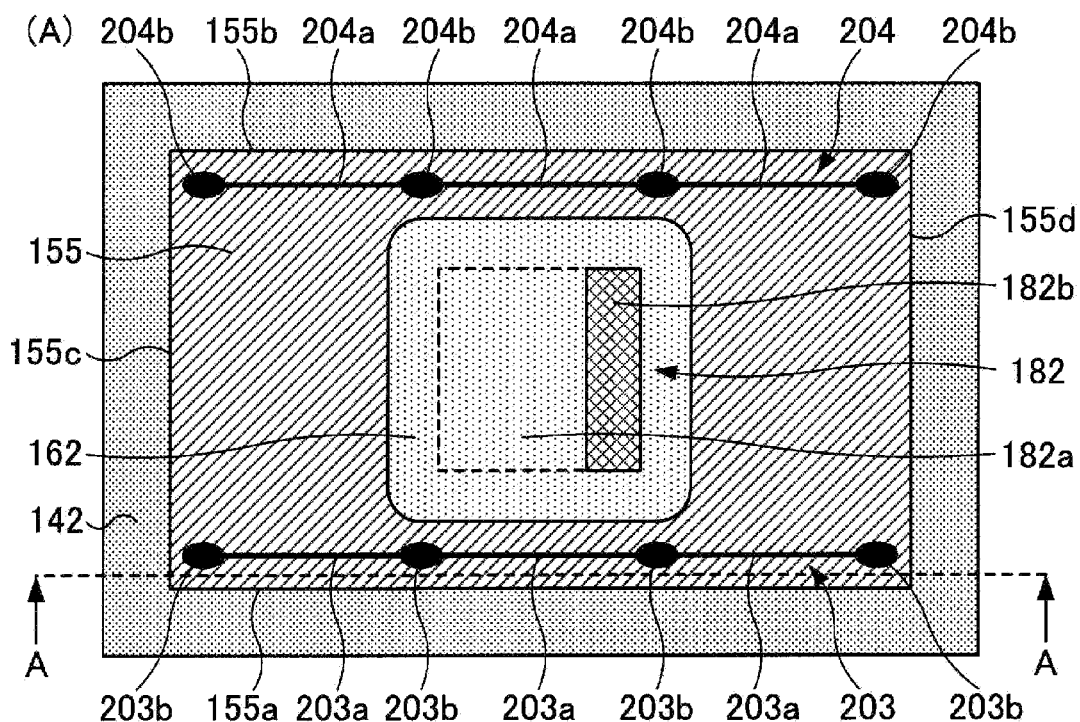
FIG. 3 is a partial enlarged view showing one example of the semiconductor device according to the first embodiment.
Figure 3:
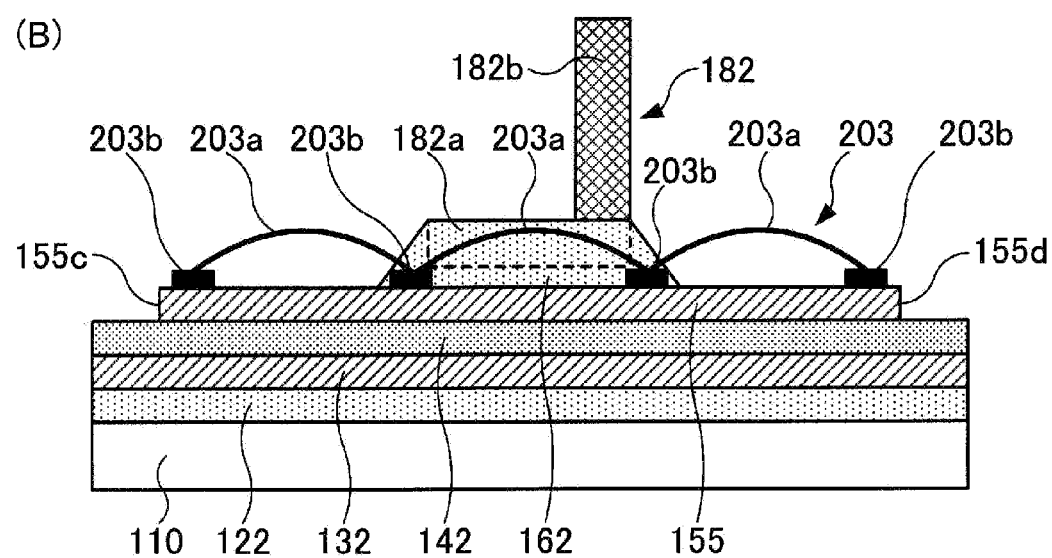

Next, a description will be given of details of a structure on the metal pattern 155. FIG. 3 is a partial enlarged view showing one example of the semiconductor device according to the first embodiment. FIG. 3(A) is a partial top view wherein a region bounded by a dashed line D1 of FIG. 1 is cut out. FIG. 3(B) corresponds to a sectional view along a dashed line A-A of FIG. 3(A).

The metal pattern 155, whose shape is rectangular, has edges 155a and 155b corresponding to the long sides and edges 155c and 155d corresponding to the short sides. The external connection terminal 182 has a base portion 182a and a protruding portion 182b. The external connection terminal 182 is disposed in such a way that the base portion 182a is positioned in the center of the metal pattern 155.

The bond 162 is formed so as to surround the external connection terminal 182. The base portion 182a of the external connection terminal 182 is joined by the bond 162. The bond 162 is spaced a predetermined distance away from each of the edges 155a to 155d of the metal pattern 155.

The wire member 203 is disposed between the external connection terminal 182 and the edge 155a of the metal pattern 155. The wire member 203 has plural wire portions 203a and plural bonding portions 203b. The plural bonding portions 203b are disposed aligned along the edge 155a. Each of the plural wire portions 203a extends along the edge 155a.

The wire member 204 is disposed between the external connection terminal 182 and the edge 155b of the metal pattern 155. The wire member 204 has plural wire portions 204a and plural bonding portions 204b. The plural bonding portions 204b are disposed aligned along the edge 155b. Each of the plural wire portions 204a extends along the edge 155b.

The diameter of the wire portions 203a and 204a is, for example, 125 to 500 μm. Also, the intervals between the plural bonding portions 203b, and between the plural bonding portions 204b, are, for example, 6 mm or less, preferably, 3 mm or less.

The external connection terminal 183, bond 162, and wire members 205 and 206 on the metal pattern 156 also have configurations the same as those of the external connection terminal 182, bond 162, and wire members 203 and 204 on the metal pattern 155.

Figure 4:
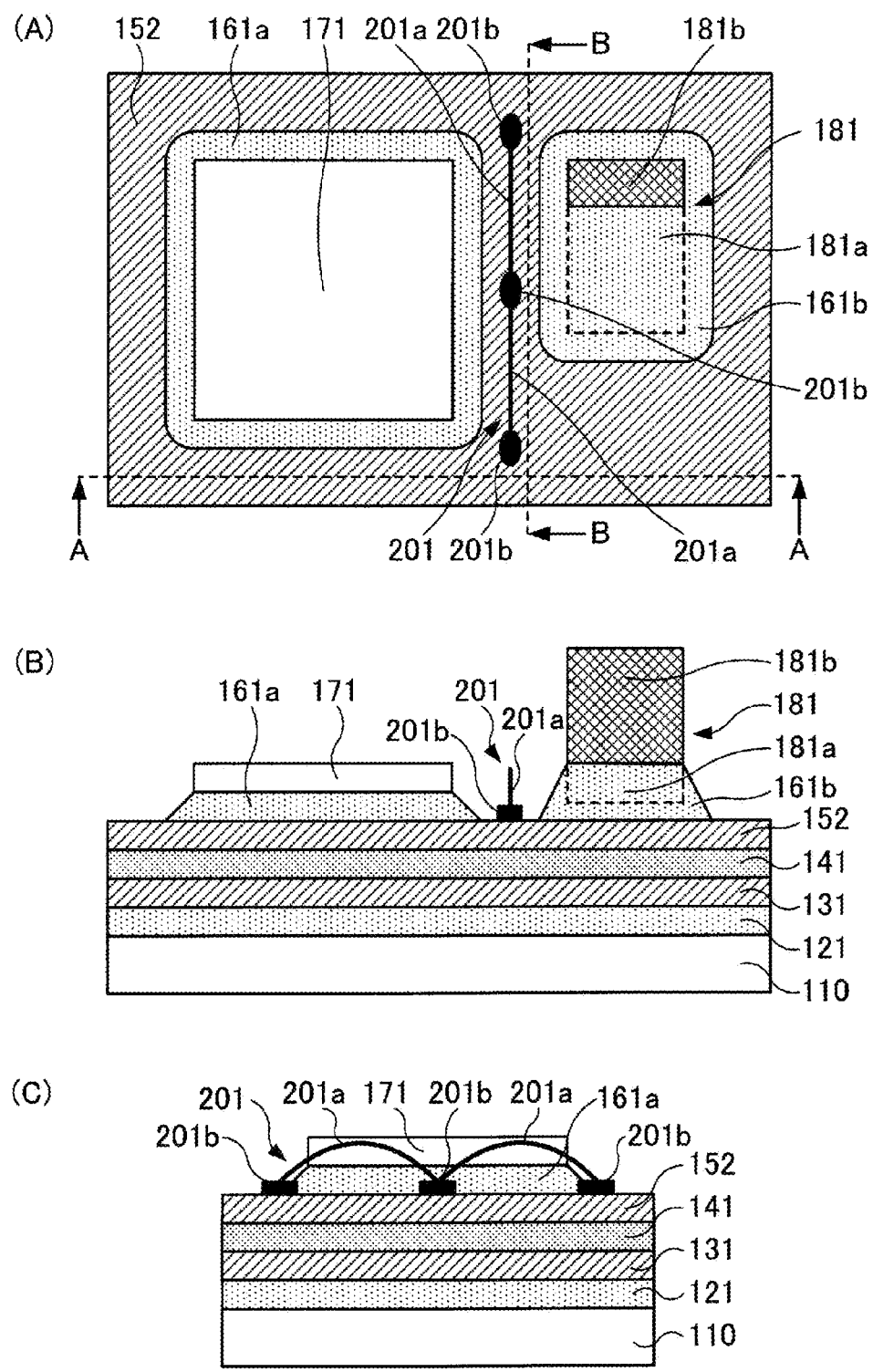
FIG. 4 is a partial enlarged view showing one example of the semiconductor device according to the first embodiment.

Next, a description will be given of details of a structure on the metal pattern 152. FIG. 4 is a partial enlarged view showing one example of the semiconductor device according to the first embodiment. FIG. 4(A) is a partial top view wherein a region bounded by a dashed line D2 of FIG. 1 is cut out. FIG. 4(B) corresponds to a sectional view along a dashed line A-A of FIG. 4(A). FIG. 4(C) corresponds to a sectional view along a dashed line B-B of FIG. 4(A).

Herein, a description will be given of the bonds 161 wherein one which joins the semiconductor element 171 is taken to be a bond 161a, and one which joins the external connection terminal 181 is taken to be a bond 161b.

The semiconductor element 171 and external connection terminal 181 are disposed adjacent to each other. A space between the metal pattern 152 and semiconductor element 171 is filled with the bond 161a. Furthermore, one portion of the bond 161a extends out around the semiconductor element 171.

The external connection terminal 181 has a base portion 181a and a protruding portion 181b. The bond 161b is formed so as to surround the external connection terminal 181. The base portion 181a of the external connection terminal 181 is joined by the bond 161b. The bond 161a and bond 161b are spaced a predetermined distance apart.

The wire member 201 is disposed between the semiconductor element 171 and external connection terminal 181. The wire member 201 has plural wire portions 201a and plural bonding portions 201b.

The plural bonding portions 201b are disposed aligned in a direction perpendicular to the direction joining the semiconductor element 171 and external connection terminal 181. Each of the plural wire portions 201a extends in a direction perpendicular to the direction joining the semiconductor element 171 and external connection terminal 181.

The diameter of the wire portions 201a is, for example, 125 to 500 μm. Also, the plural bonding portions 201b are at intervals of, for example, 6 mm or less, preferably, 3 mm or less.

In the same way as the wire member 201, the wire member 202 is also formed between the semiconductor element 173 and external connection terminal 181.

As heretofore described, in the semiconductor device 100, the wire members 203 and 204, separate from the wiring bonding wires, which contain a material repellent to the bond 162, are formed between the external connection terminal 182 and the edges 155a and 155b of the metal pattern 155, on the metal pattern 155, as shown in FIG. 3.

According to this configuration, even when the bond 162 which joins the external connection terminal 182 flows and spreads around when mounting the external connection terminal 182 on the metal pattern 155 across the bond 162, or the like, the wire members 203 and 204 repel the bond 162, and the bond 162 is stemmed by the wire members 203 and 204. Because of this, it is possible to prevent the bond 162 from reaching the edges 155a and 155b of the metal pattern 155.

When the bond 162 spreads as far as the edges 155a and 155b of the metal pattern 155, high stress is applied to the insulating substrate 142 in the vicinity of the edges 155a and 155b of the metal pattern 155 when heat is applied, and there is a possibility of a crack occurring. When a crack occurs in the insulating substrate 142, there is a possibility of partial discharge occurring, or of a drop in breakdown voltage occurring.

Figure 5:
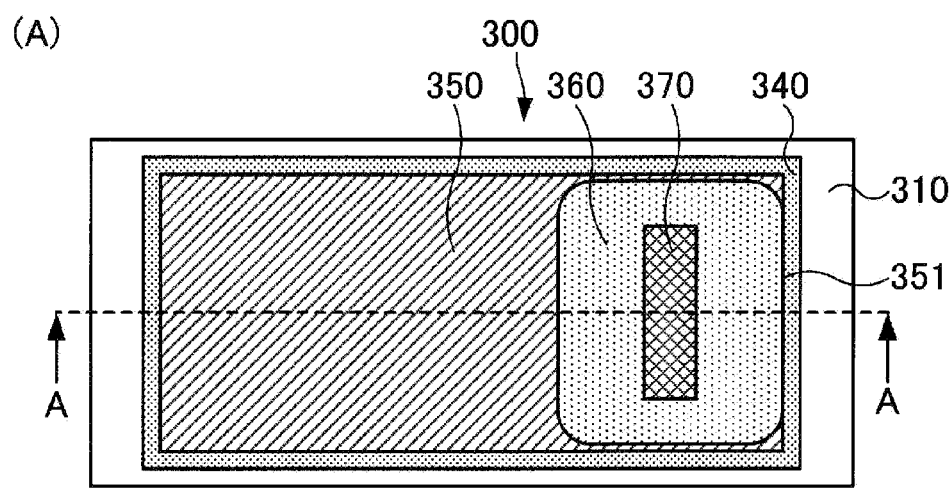
FIG. 5 is a diagram showing a device of Reference Example 1.
Figure 5:
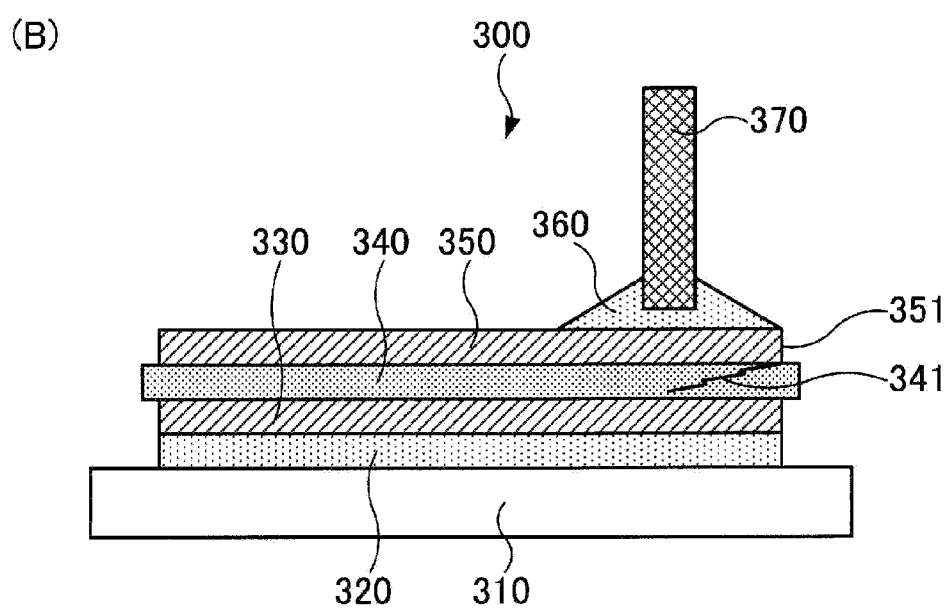
Figure 6:
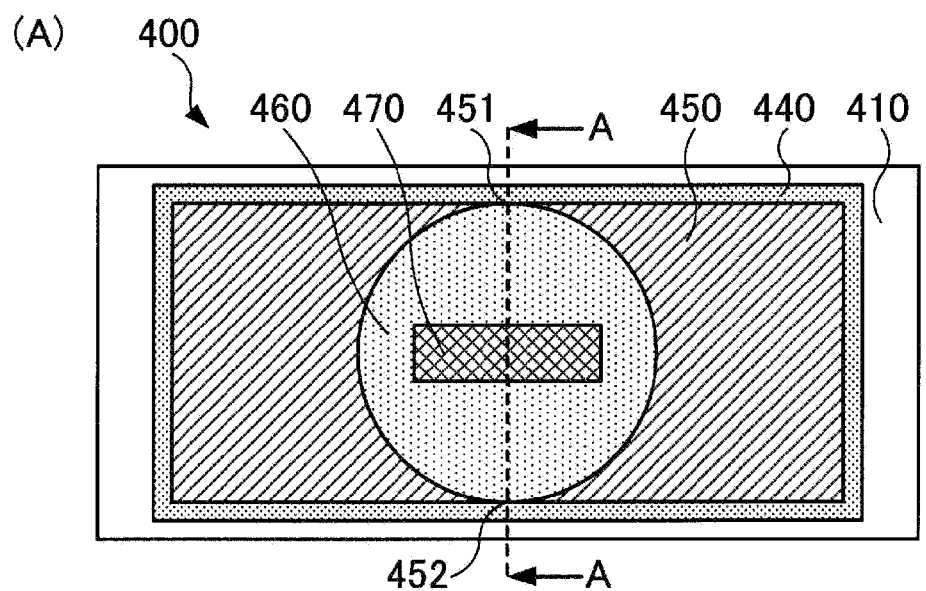
FIG. 6 is a diagram showing a device of Reference Example 2.
Figure 6:
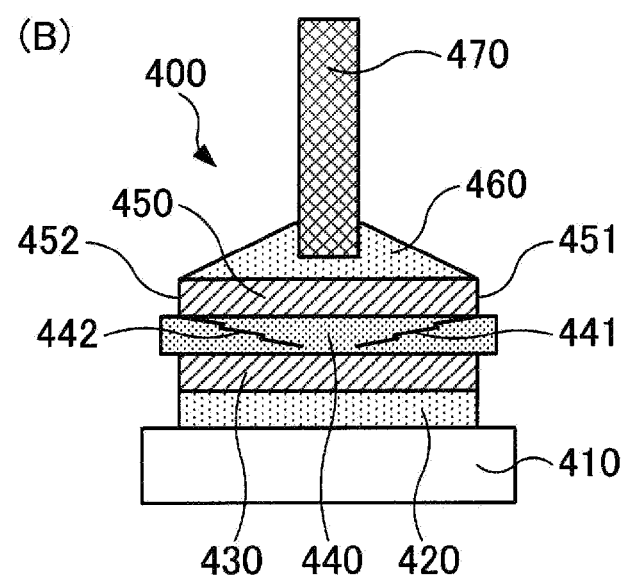

Herein, a description will be given, using reference examples, of an occurrence of a crack. FIG. 5 is a diagram showing a device of Reference Example 1. FIG. 6 is a diagram showing a device of Reference Example 2. FIG. 5(A) is a top view showing the device of Reference Example 1, and FIG. 5(B) corresponds to a sectional view along a dashed line A-A of FIG. 5(A). FIG. 6(A) is a top view showing the device of Reference Example 2, and FIG. 6(B) corresponds to a sectional view along a dashed line A-A of FIG. 6(A).

Firstly, a description will be given of a device 300 of Reference Example 1. As shown in FIGS. 5(A) and (B), the device 300 has a metallic substrate 310 with a copper alloy as a material. A copper foil 330 is formed on the metallic substrate 310 across solder 320. A ceramic substrate 340 is formed on the copper foil 330. A copper foil 350 is formed on the ceramic substrate 340. An external connection terminal 370 with copper as a material is mounted on the copper foil 350 across solder 360.

Herein, the external connection terminal 370 is disposed in proximity to an edge 351 of the copper foil 350, and the solder 360 spreads as far as the edge 351 of the copper foil 350. In this case, as the thermal expansion coefficients of the ceramic substrate 340, copper foil 350, and solder 360 differ substantially, when heat is applied to the device 300, high stress is applied to the ceramic substrate 340 positioned in the vicinity of the edge 351 of the copper foil 350, and there is a possibility of a crack 341 occurring, as shown in FIG. 5(B).

Next, a description will be given of a device 400 of Reference Example 2. As shown in FIGS. 6(A) and (B), the device 400 has a metallic substrate 410 with a copper alloy as a material. A copper foil 430 is formed on the metallic substrate 410 across solder 420. A ceramic substrate 440 is formed on the copper foil 430. A copper foil 450 is formed on the ceramic substrate 440. An external connection terminal 470 with copper as a material is mounted on the copper foil 450 across solder 460.

Herein, the external connection terminal 470 is disposed in the center of the copper foil 450, and the solder 460 spreads as far as edges 451 and 452 of the copper foil 450. In this case, as the thermal expansion coefficients of the ceramic substrate 440, copper foil 450, and solder 460 differ substantially, when heat is applied to the device 400, high stress is applied to the ceramic substrate 440 positioned in the vicinity of the edges 451 and 452 of the copper foil 450, and there is a possibility of cracks 441 and 442 occurring, as shown in FIG. 6(B).

With the semiconductor device 100, as it is possible to prevent the bond 162 from reaching the edges 155a and 155b of the metal pattern 155, as heretofore described, it is possible to suppress a possibility of cracks occurring in the insulating substrate 142 in the vicinity of the edges 155a and 155b of the metal pattern 155. Also, with the semiconductor device 100, as the wire members 205 and 206 are formed on the metal pattern 156 too, in the same way as on the metal pattern 155, it is possible to suppress a possibility of a crack occurring in the insulating substrate 142 in the vicinity of an edge of the metal pattern 156. Because of this, it is possible to improve the reliability of the semiconductor device 100.

Figure 7:
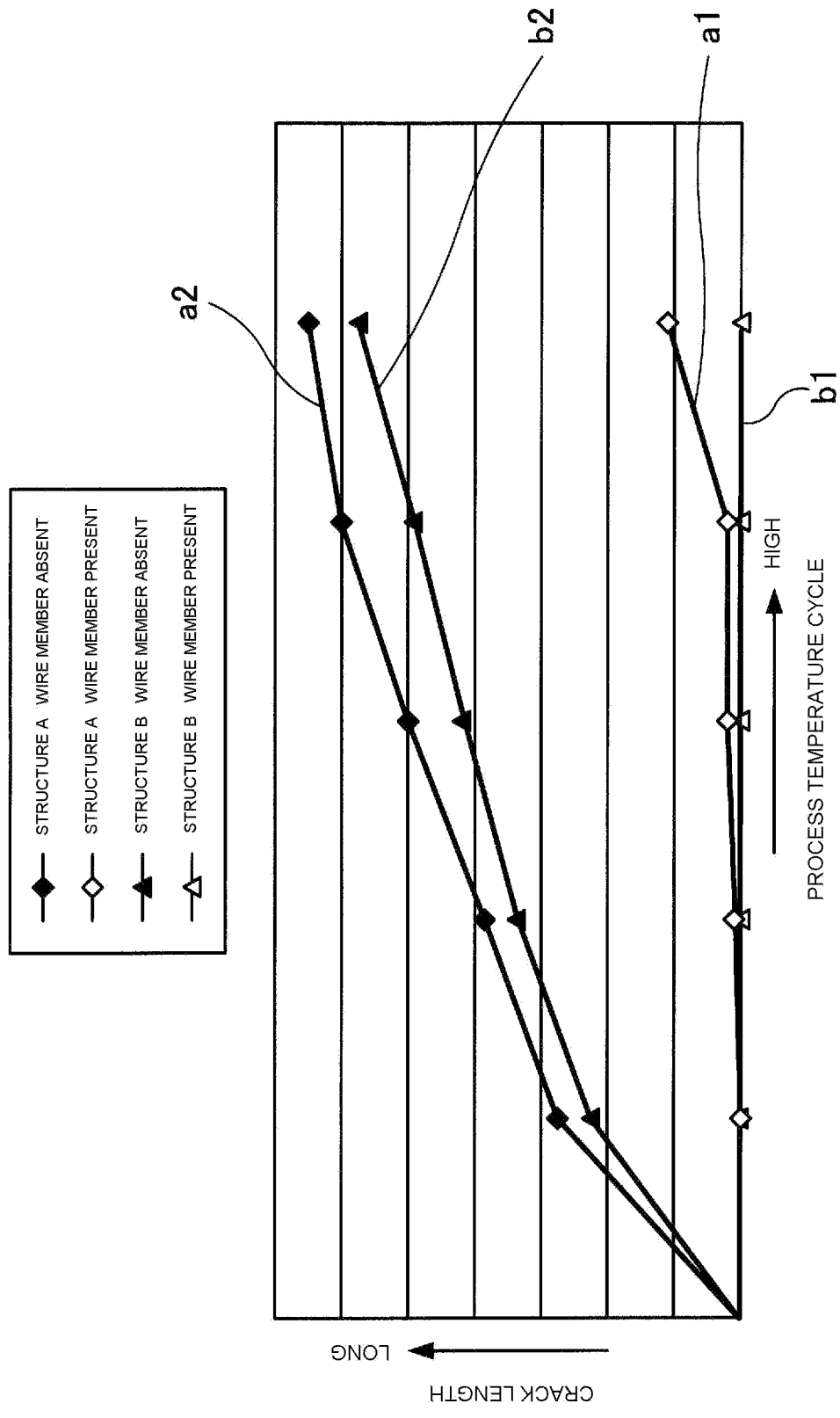
FIG. 7 is a diagram showing test results in Reference Example 2.

FIG. 7 is a diagram showing test results in Reference Example 2. The horizontal axis of the graph shown in FIG. 7 indicates a process temperature cycle, and the vertical axis indicates the crack length of a crack occurring in the ceramic substrate 440. The graph shows results obtained by carrying out temperature cycle tests with the device 400 on a structure A wherein the copper foil 450 is formed thick, and on a structure B wherein the copper foil 450 is formed thin, when a wire member is formed, and when no wire member is formed, between the external connection terminal 470 and each of the edges 451 and 452 of the copper foil 450.

A polygonal line a1 shows test results in the structure A when wire members are formed. A polygonal line a2 shows test results in the structure A when no wire members are formed. A polygonal line b1 shows test results in the structure B when wire members are formed. A polygonal line b2 shows test results in the structure B when no wire members are formed.

It can be seen from the graph that, in each of the structures A and B, the crack length of a crack occurring in the ceramic substrate 440 is shorter when wire members are formed. In the structure B, little or no cracking occurs, as shown by the polygonal line b1.

Furthermore, in the semiconductor device 100, the wire portions 203a and 204a of the wire members 203 and 204 extend respectively along the edges 155a and 155b of the metal pattern 155, as shown in FIG. 3.

Because of this, the wire portions 203a and 204a extend in a direction crossing directions in which the bond 162 flows, meaning that it is possible to effectively stem the bond 162 flowing toward the edges 155a and 155b of the metal pattern 155. Also, in the same way as the wire members 203 and 204, the wire members 205 and 206 can also effectively stem the bond 162 flowing toward the edges of the metal pattern 156.

Furthermore, with the semiconductor device 100, as the wire members 203 to 206 can be formed by the same wire bonding process as the wiring bonding wires 191 to 198, no new step is necessary in order to provide the wire members 203 to 206. Because of this, it is possible to curb manufacturing cost.

Furthermore, as the wire members 203 to 206 are low in material cost, it is possible to reduce the cost of the semiconductor device 100.

Also, in the semiconductor device 100, the wire member 201, separate from the wiring bonding wires, which contains a material repellent to the bonds 161a and 161b is formed between the semiconductor element 171 and external connection terminal 181, on the metal pattern 152, as shown in FIG. 4.

According to this configuration, even when the bond 161a and bond 161b flow and spread around when mounting the semiconductor element 171 and external connection terminal 181 on the metal pattern 152 across the bonds 161a and 161b, or the like, the wire member 201 repels the bonds 161a and 161b, and the bonds 161a and 161b are stemmed by the wire member 201. Because of this, it is possible to prevent the bond 161a and bond 161b from meeting.

Figure 8:
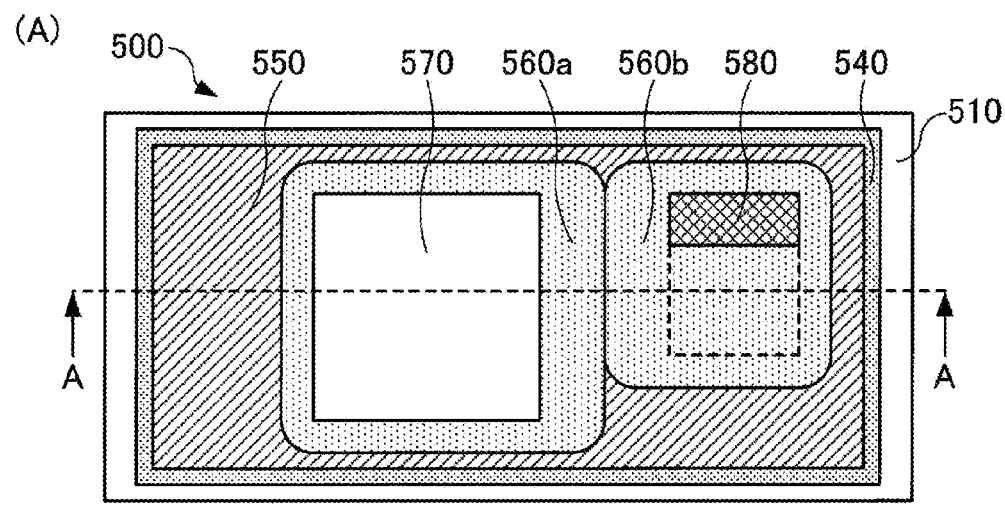
FIG. 8 is a diagram showing a device of Reference Example 3.
Figure 8:
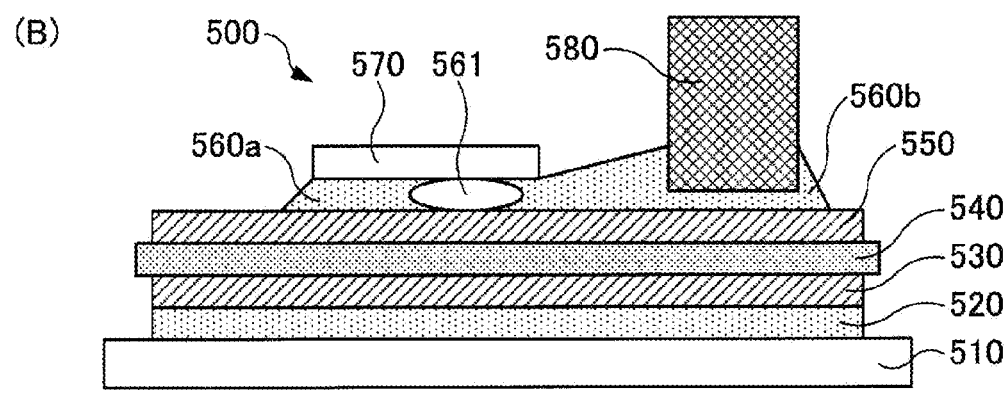
Figure 8:
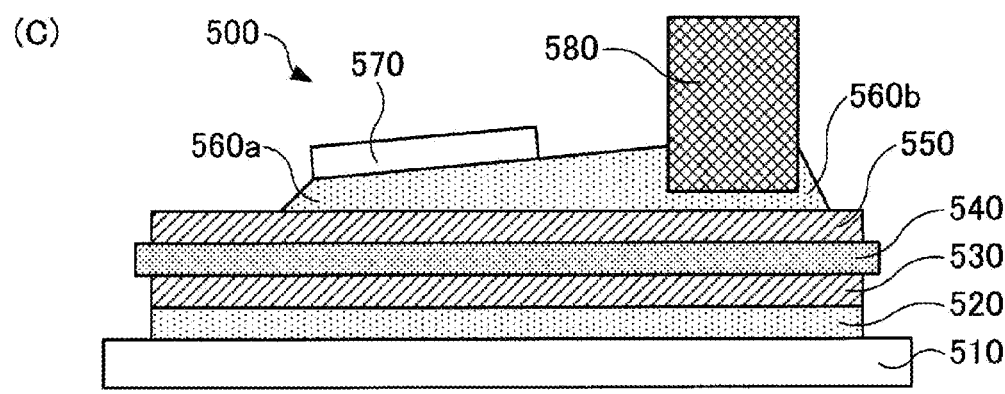

When the bond 161a and bond 161b meet, it may have an effect on the junction of the semiconductor element 171. A description will be given, using Reference Example 3, of the effect. FIG. 8 is a diagram showing a device of Reference Example 3.

FIG. 8(A) is a top view showing the device of Reference Example 3. FIGS. 8(B) and (C) correspond to a sectional view along a dashed line A-A of FIG. 8(A). Herein, FIGS. 8(B) and (C) show sectional views of the device when differing phenomena occur.

As shown in FIGS. 8(A) to (C), a device 500 has a metallic substrate 510 with a copper alloy as a material. A copper foil 530 is formed on the metallic substrate 510 across solder 520. A ceramic substrate 540 is formed on the copper foil 530. A copper foil 550 is formed on the ceramic substrate 540. A semiconductor element 570 is mounted across solder 560a, and furthermore, an external connection terminal 580 with copper as a material is mounted across solder 560b, on the copper foil 550.

Herein, the semiconductor element 570 and external connection terminal 580 are disposed adjacent to each other, and the solder 560a and solder 560b meet. In this case, there is a possibility of the following two phenomena occurring.

Firstly, as the first phenomenon, when the solder 560a and solder 560b meet, the solder 560a is drawn to the external connection terminal 580 side, and there is a possibility of a void 561 occurring below the semiconductor element 570, as shown in FIG. 8(B). In this case, the thermal resistance of a heat dissipation path from the semiconductor element 570 toward the metallic substrate 510 increases, and there is a possibility of heat dissipation decreasing. When heat dissipation decreases, the semiconductor element 570 is not sufficiently cooled, leading to a higher temperature, which affects the wires and the like, and reliability decreases.

Next, as the second phenomenon, when the solder 560a and solder 560b meet, the solder 560b is drawn to the semiconductor element 570 side, and there is a possibility of a bond below the semiconductor element 570 becoming thicker, as shown in FIG. 8(C). In this case too, the thermal resistance of the heat dissipation path from the semiconductor element 570 toward the metallic substrate 510 increases, and there is a possibility of heat dissipation decreasing.

The thermal conductivity of solder, being in the order of 40 to 60 W/mK, is significantly lower than the thermal conductivity (in the order of 200 to 400 W/mK) of a metal such as aluminum or copper.

With the semiconductor device 100, as it is possible to prevent the bond 161a and bond 161b from meeting, as heretofore described, it is possible to avoid a phenomenon wherein a void occurs or a bond below the semiconductor element 171 becomes thicker. Because of this, it is possible to suppress an increase in the thermal resistance of the heat dissipation path from the semiconductor element 171 toward the substrate 110.

Also, with the semiconductor device 100, as the wire member 202 is also formed between the semiconductor element 173 and external connection terminal 181, in the same way, on the metal pattern 152, it is possible to prevent the bond which joins the semiconductor element 173 and the bond 161b which joins the external connection terminal 181 from meeting, and it is possible to suppress an increase in the thermal resistance of the heat dissipation path from the semiconductor element 173 toward the substrate 110.

Because of this, with the semiconductor device 100, it is possible to dispose the semiconductor elements 171 and 173 and external connection terminal 181 in proximity on the same metal pattern 152 without decreasing heat dissipation. That is, it is possible to realize the semiconductor device 100 while balancing a reduction in size and an improvement in heat dissipation.

Furthermore, with the semiconductor device 100, the wire portion 201a of the wire member 201 extends in a direction perpendicular to the direction joining the semiconductor element 171 and external connection terminal 181, as shown in FIG. 4.

Because of this, the wire portion 201a extends in a direction crossing directions in which the bonds 161a and 161b flow, meaning that it is possible to effectively stem the bonds 161a and 161b. Also, in the same way as with the wire member 201, the wire member 202 can also effectively stem the bond which joins the semiconductor element 173 and the bond 161b which joins the external connection terminal 181.

Furthermore, with the semiconductor device 100, as the wire members 201 and 202 can be formed by the same wire bonding process as the wiring bonding wires 191 to 198, no new step is necessary in order to provide the wire members 201 and 202. Because of this, it is possible to curb manufacturing cost.

Furthermore, as the wire members 201 and 202 are low in material cost, it is possible to reduce the cost of the semiconductor device 100.

FIG. 9 is a diagram showing test results in Reference Example 3. The table shown in FIG. 9 shows results obtained by counting the number of cases (the number of occurrences) of the solder 560a and solder 560b meeting when a large number of semiconductor devices, wherein a wire member with a bonding pitch of 6 mm is formed, a wire member with a bonding pitch of 3 mm is formed, and no wire member is formed, between the semiconductor element 570 and external connection terminal 580, are each loaded into the device 500 of Reference Example 3.

As shown in the table, the rate of occurrence when the wire member with a bonding pitch of 3 mm is formed is 0%. The rate of occurrence when the wire member with a bonding pitch of 6 mm is formed is low in value at 6%. The rate of occurrence when no wire member is formed is 100%. As can be seen, by forming a wire member, it is possible to prevent the solder 560a and solder 560b from meeting.

With the semiconductor device 100, it is also possible to obtain advantages the same as the heretofore described advantages when other electronic parts, for example, semiconductor elements, are mounted in place of the external connection terminals 181 to 183.

Modification Example 1

Figure 10:
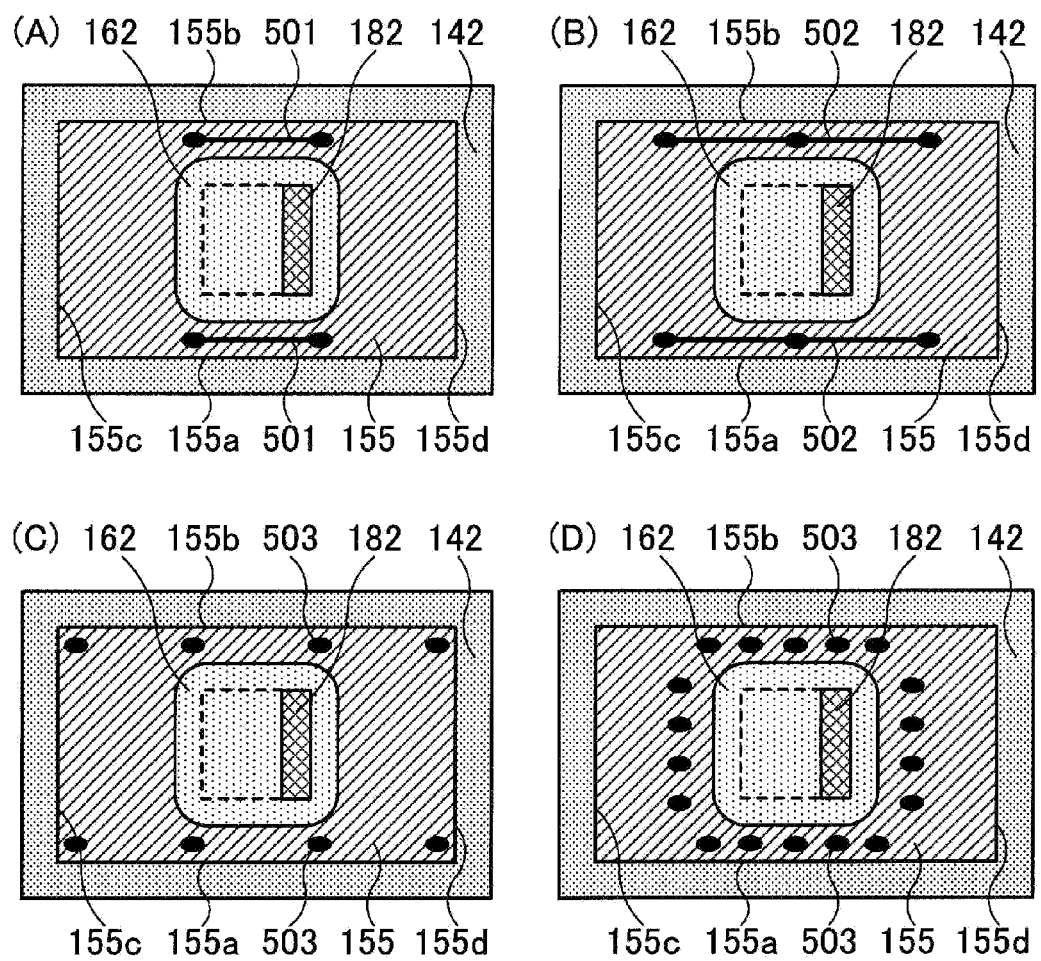
FIG. 10 is a diagram showing Modification Example 1 of the semiconductor device according to the first embodiment.
Figure 11:
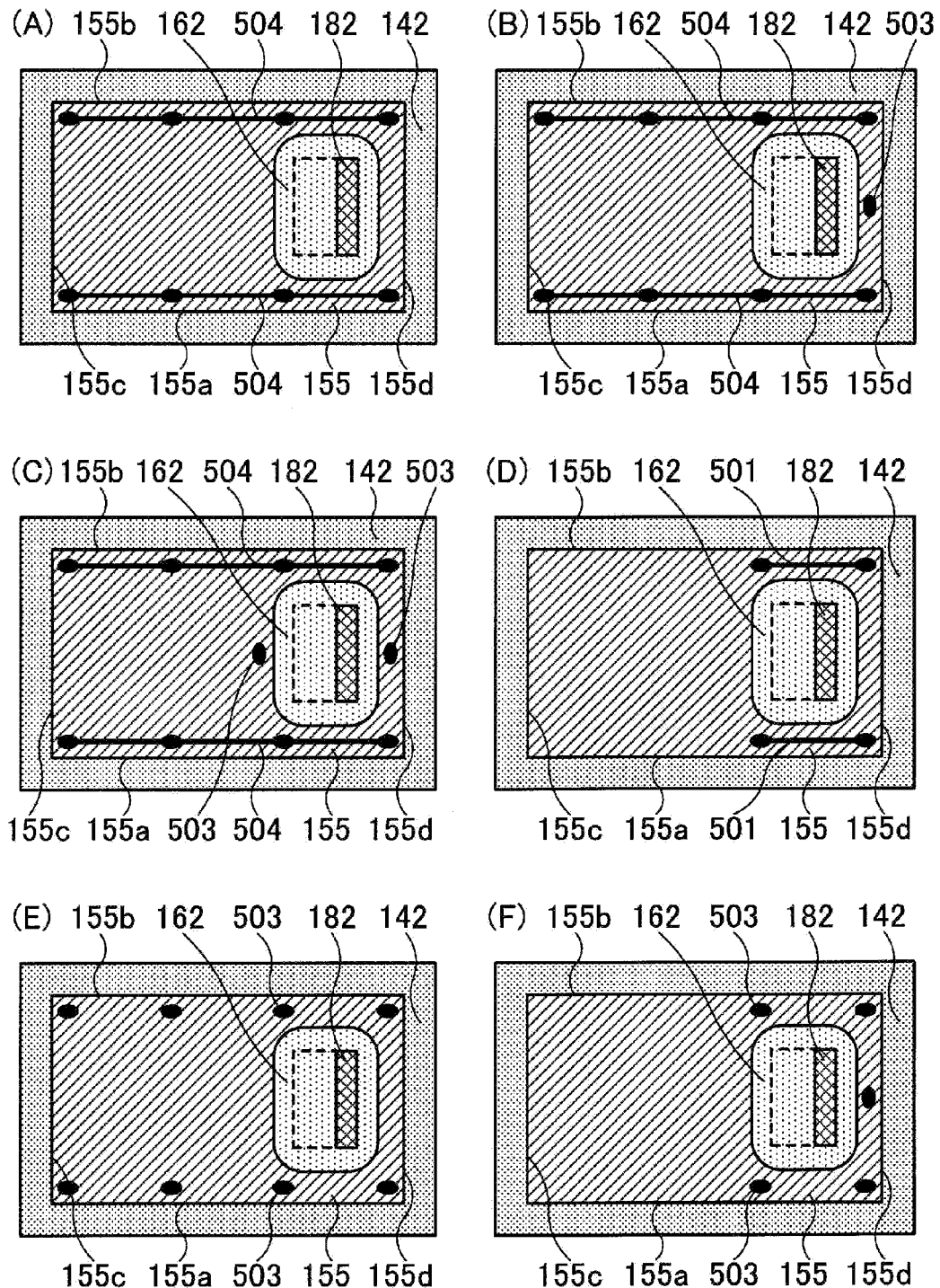
FIG. 11 is a diagram showing Modification Example 1 of the semiconductor device according to the first embodiment.
Figure 12:
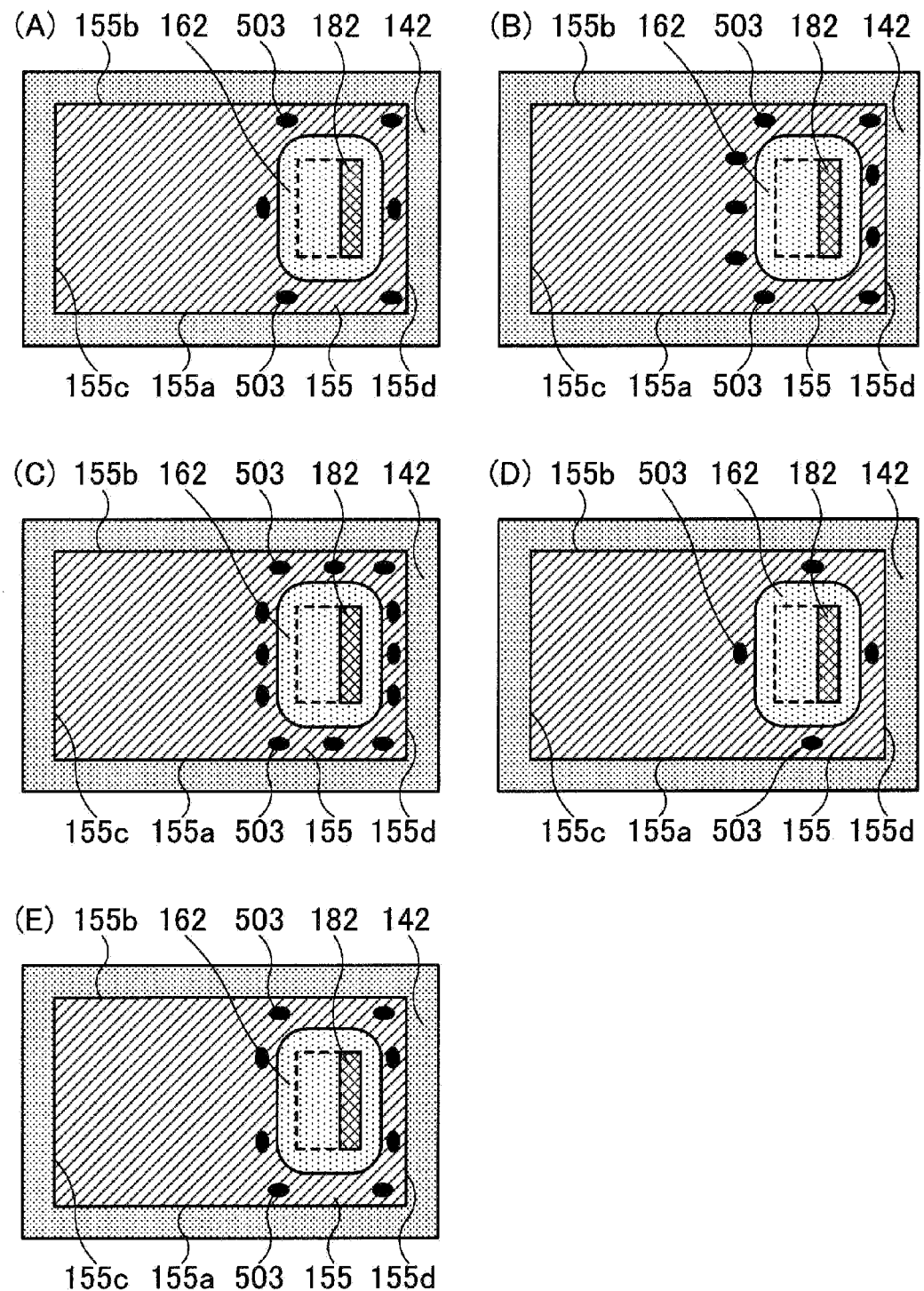
FIG. 12 is a diagram showing Modification Example 1 of the semiconductor device according to the first embodiment.

A description will be given, as Modification Example 1, of plural modification examples wherein other wire members are formed on the metal patterns 155 and 156 in place of the wire members 203 to 206. FIGS. 10 to 12 are diagrams showing Modification Example 1 of the semiconductor device according to the first embodiment. Herein, a description will be given of a structure on the metal pattern 155 as a representative.

The individual drawings shown in FIGS. 10 to 12 show the modification examples differing from one another. Also, each of the drawings shown in FIGS. 10 to 12 corresponds to the partial top view shown in FIG. 3(A).

In the modification example shown in FIG. 10(A), a wire member 501 having a wire portion and plural bonding portions is formed between the external connection terminal 182 and each of the edges 155a and 155b of the metal pattern 155.

In the modification example shown in FIG. 10(B), a wire portion 502 having plural wire portions and plural bonding portions is formed between the external connection terminal 182 and each of the edges 155a and 155b of the metal pattern 155.

In the modification example shown in FIG. 10(C), plural wire members 503, from each of which a wire portion is cut, and each of which is formed of only a bonding portion, are formed. The plural wire members 503 are disposed, aligned along each of the edges 155a and 155b, between the external connection terminal 182 and each of the edges 155a and 155b of the metal pattern 155.

Herein, a wire member formed of only a bonding portion is also called a wire member. The wire members 503 do not have any wire portion, but are such that the bond 162 can be stemmed by the bonding portions.

Furthermore, because of the fact that the wire members 503 have no wire portion, the plural wire members 503 can be disposed at close intervals by a wire bonding device.

In the modification example shown in FIG. 10(D), the plural wire members 503 are formed in such away as to surround the external connection terminal 182.

In the modification example shown in FIG. 11(A), the external connection terminal 182 is in proximity to the edge 155d of the metal pattern 155. The same also applies to the modification examples shown in FIGS. 11(B) to (F) and FIGS. 12(A) to (E).

Furthermore, in the modification example shown in FIG. 11(A), a wire member 504 having plural wire portions and plural bonding portions is formed between the external connection terminal 182 and each of the edges 155a and 155b of the metal pattern 155.

In the modification example shown in FIG. 11(B), the wire member 504 is formed between the external connection terminal 182 and each of the edges 155a and 155b of the metal pattern 155. Furthermore, the wire member 503 is formed between the external connection terminal 182 and the edge 155d of the metal pattern 155.

In the modification example shown in FIG. 11(C), the wire member 504 is formed between the external connection terminal 182 and each of the edges 155a and 155b of the metal pattern 155. Furthermore, the wire member 503 is formed between the external connection terminal 182 and each of the edges 155c and 155d of the metal pattern 155.

In the modification example shown in FIG. 11(D), the wire member 501 is formed between the external connection terminal 182 and each of the edges 155a and 155b of the metal pattern 155.

In the modification example shown in FIG. 11(E), the plural wire members 503 are disposed, aligned along each of the edges 155a and 155b, between the external connection terminal 182 and each of the edges 155a and 155b of the metal pattern 155.

In the modification example shown in FIG. 11(F), the wire members 503 are formed between the external connection terminal 182 and the edges 155a, 155b, and 155d of the metal pattern 155.

In each of the modification examples shown in FIGS. 12(A) to (E), the plural wire members 503 are formed in such a way as to surround the external connection terminal 182.

Modification Example 2

Figure 13:
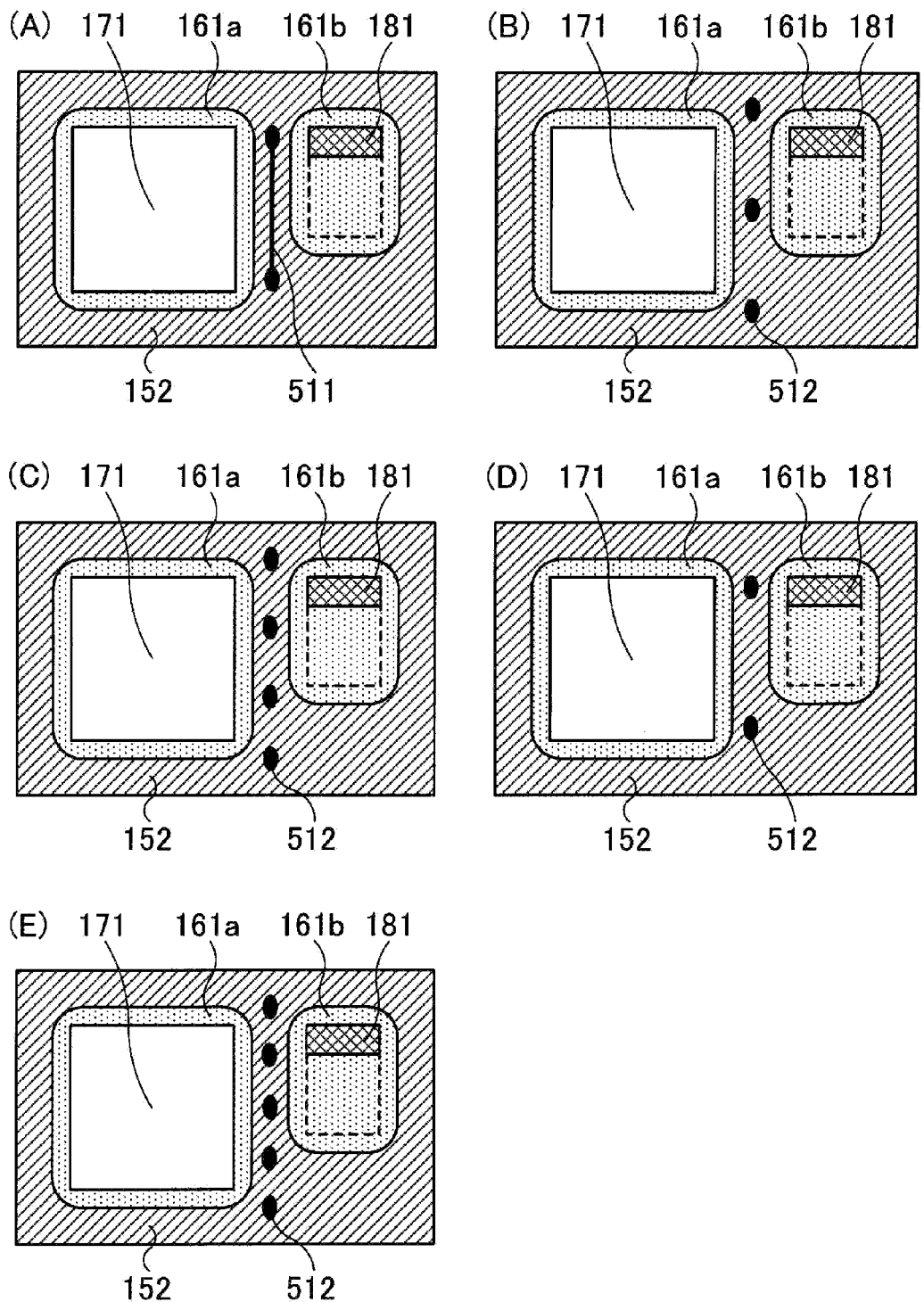
FIG. 13 is a diagram showing Modification Example 2 of the semiconductor device according to the first embodiment.

Next, a description will be given, as Modification Example 2 of the semiconductor device 100, of plural modification examples wherein other wire members are formed on the metal pattern 152, in place of the wire members 201 and 202. FIG. 13 is a diagram showing Modification Example 2 of the semiconductor device according to the first embodiment. Herein, a description will be given of a structure between the semiconductor device 171 and external connection terminal 181 as a representative.

The individual drawings shown in FIG. 13 show modification examples differing from one another. Also, each drawing shown in FIG. 13 corresponds to the partial top view shown in FIG. 4(A).

In the modification example shown in FIG. 13(A), a wire member 511 having a wire portion and plural bonding portions is formed between the external connection terminal 181 and semiconductor element 171.

In the modification examples shown in FIGS. 13(B) to (E), plural wire members 512, from each of which a wire portion is cut, and each of which is formed of only a bonding portion, are formed. The plural wire members 512 are formed between the external connection terminal 181 and semiconductor element 171, and disposed aligned in a direction crossing the direction joining the external connection terminal 181 and semiconductor element 171.

The wire members 512 have no wire portion, but are such that the bonds 161a and 161b can be stemmed by the bonding portions.

Furthermore, because of the fact that the wire members 512 have no wire portion, the plural wire members 512 can be disposed at close intervals by a wire bonding device.

Second Embodiment

Figure 14:
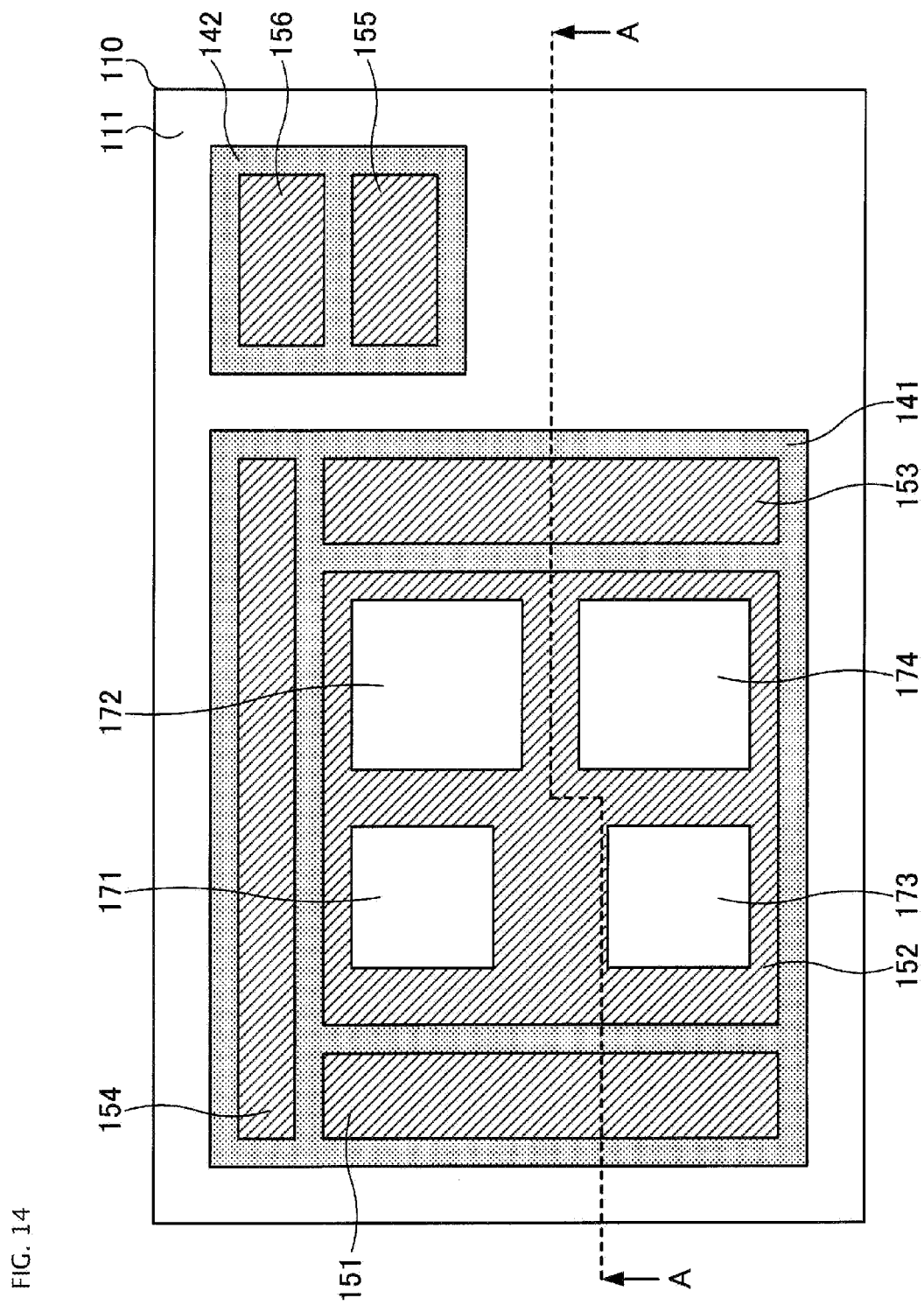
FIG. 14 is a process diagram showing an example of a semiconductor device according to a second embodiment.
Figure 15:
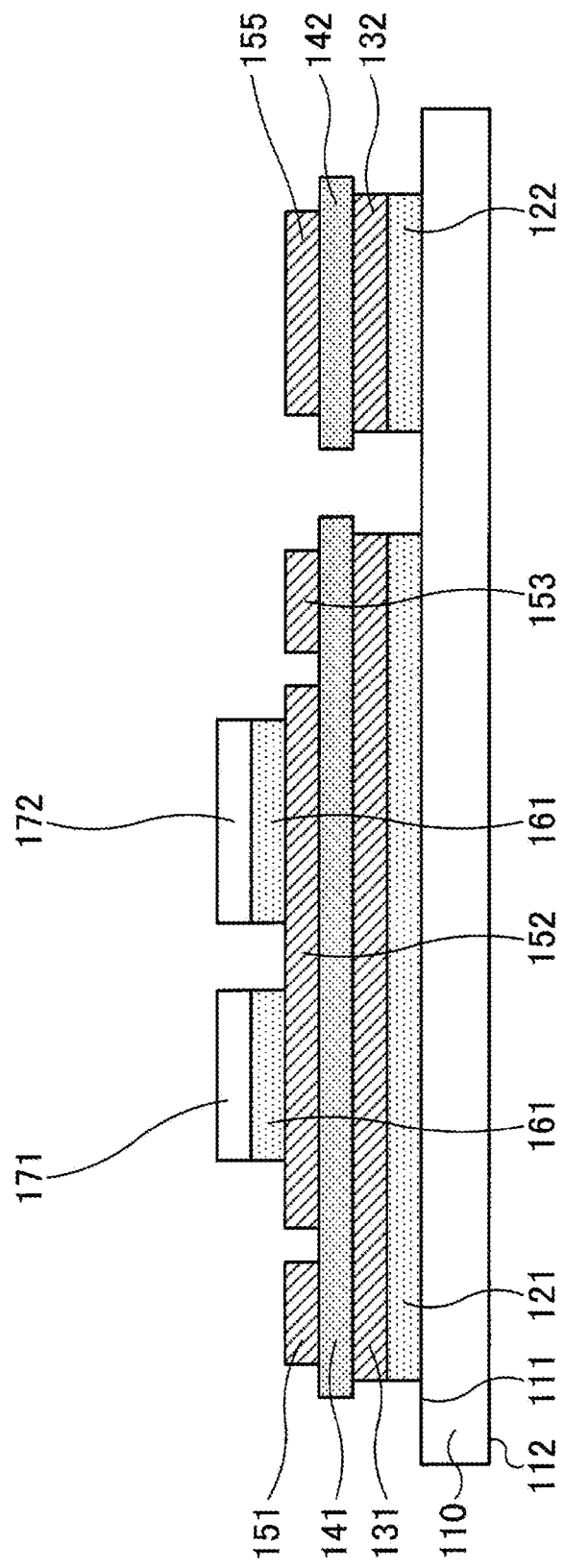
FIG. 15 is a process diagram showing the example of the semiconductor device according to the second embodiment.
Figure 16:
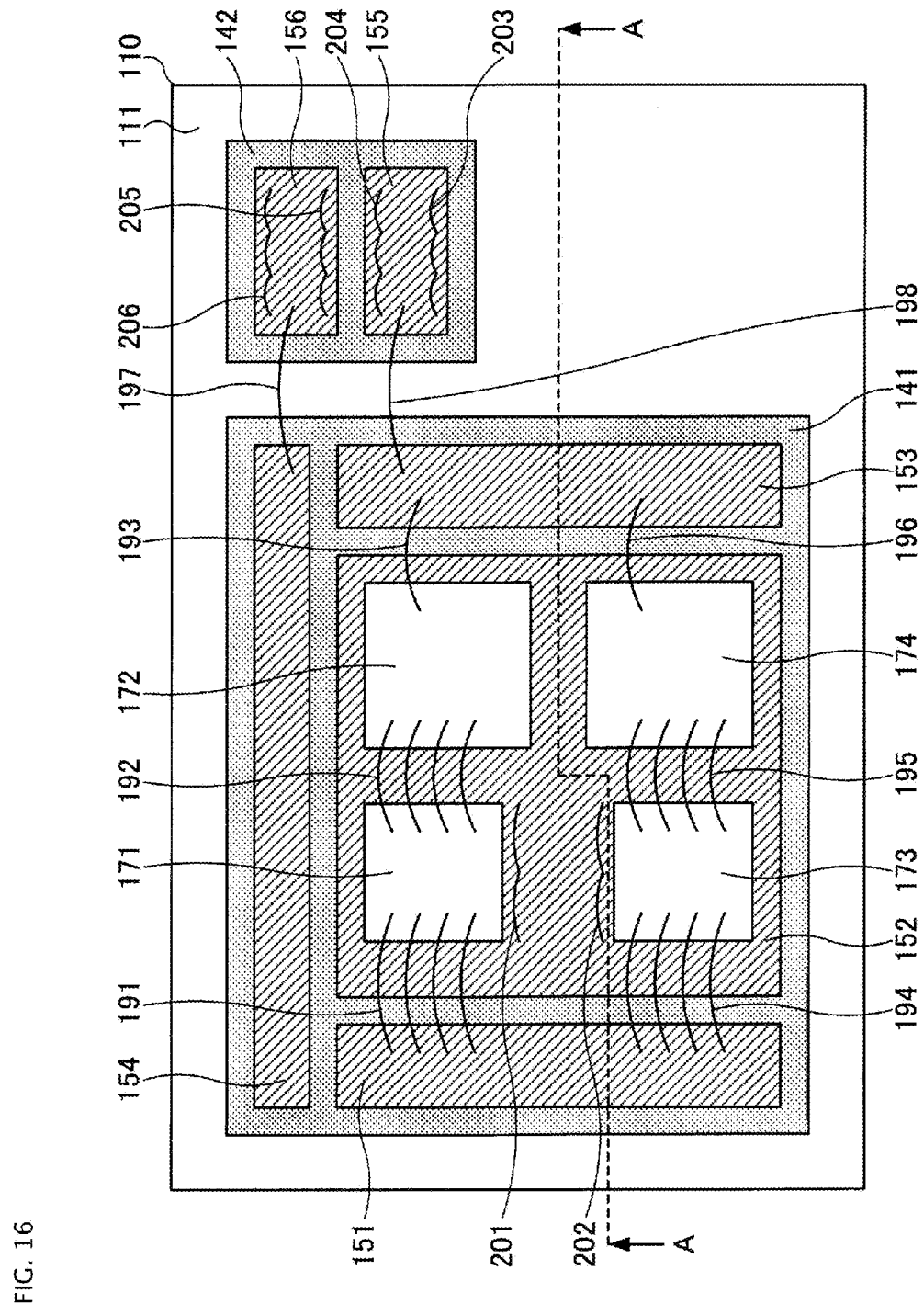
FIG. 16 is a process diagram showing the example of the semiconductor device according to the second embodiment.
Figure 17:
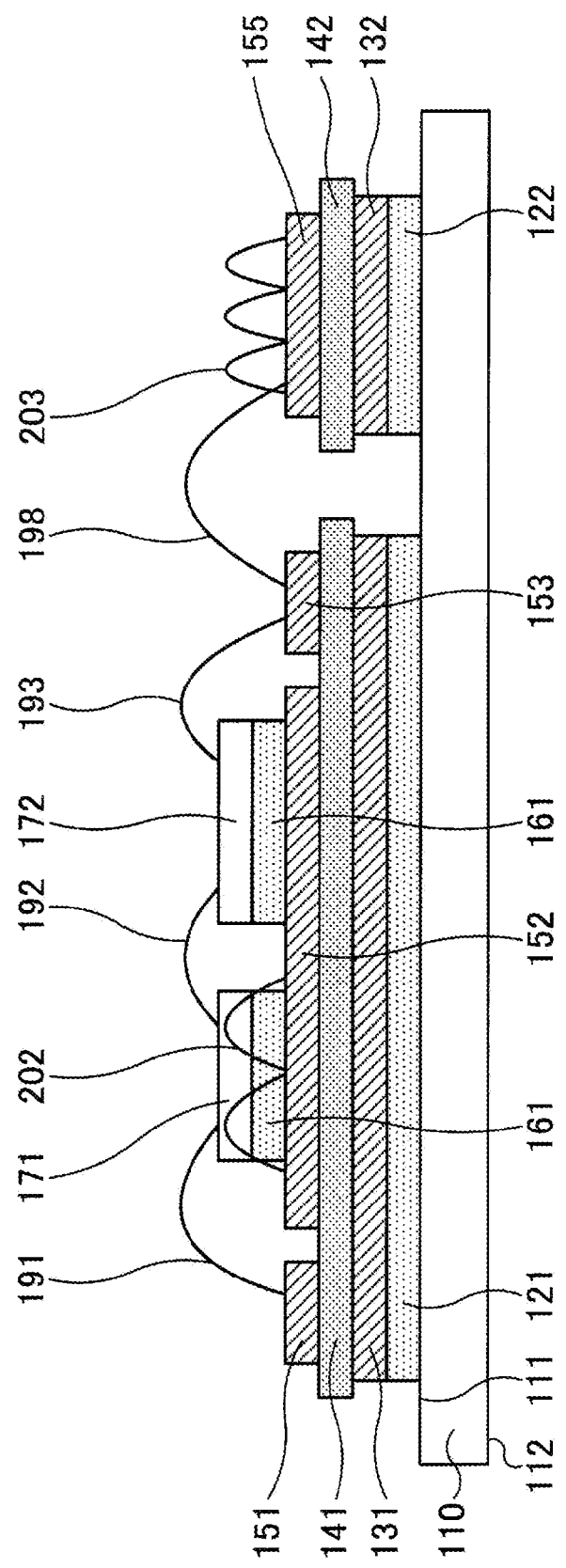
FIG. 17 is a process diagram showing the example of the semiconductor device according to the second embodiment.

Next, a description will be given, as a second embodiment, of a method of manufacturing the semiconductor device 100 of the first embodiment. FIGS. 14 to 17 are process diagrams showing one example of a semiconductor device manufacturing method according to the second embodiment. FIG. 14 is a top view, and FIG. 15 is a sectional view along a dashed line A-A of FIG. 14. FIG. 16 is a top view, and FIG. 17 is a sectional view along a dashed line A-A of FIG. 16.

Firstly, there is prepared a layered body wherein the metal patterns 131 and 132 are formed on the substrate 110 across the bonds 121 and 122, the insulating substrates 141 and 142 are formed on the metal patterns 131 and 132, and the metal patterns 151 to 156 are formed on the insulating substrates 141 and 142, as shown in FIGS. 14 and 15. Then, the semiconductor elements 171 to 174 are mounted across the bonds 161 on the metal pattern 152 on the layered body.

Next, the wiring bonding wires 191 to 198 and wire members 201 to 206 are formed using a wire bonding device, as shown in FIGS. 16 and 17. That is, the wiring bonding wires 191 to 198 and wire members 201 to 206 are formed in the same wiring bonding step.

Next, the bonds 161 are supplied onto the metal pattern 152, and the bond 162 is supplied onto the metal patterns 155 and 156. Subsequently, the external connection terminal 181 is mounted on the metal pattern 152 across the bond 161, the external connection terminal 182 is mounted on the metal pattern 155 across the bond 162, and the external connection terminal 183 is mounted on the metal pattern 156 across the bond 162. The semiconductor device 100 shown in FIGS. 1 and 2 is produced by the above process.

In this way, according to the semiconductor device manufacturing method of the second embodiment, the wire members 201 to 206 are formed by the same wire bonding process as the wiring bonding wires 191 to 198.

According to this configuration, no new step is necessary in order to form the wire members 201 to 206. Because of this, it is possible to curb manufacturing cost.

The heretofore described simply illustrates the principle of the invention. Furthermore, the invention, many modifications and alterations of which can be made by those skilled in the art, is not limited to the heretofore illustrated and described exact configurations and applications, and corresponding modification examples and equivalents are deemed to be in the scope of the invention encompassed by the appended claims and their equivalents.

DESCRIPTION OF THE REFERENCE NUMERALS

100 Semiconductor device
110 Substrate
111 Front surface
112 Rear surface
121, 122, 161, 161a, 161b, 162 Bond
131, 132, 151 to 156 Metal pattern
141, 142 Insulating substrate
155a to 155d Edge
171 to 174 Semiconductor element
181 to 183 External connection terminal
181a, 182a Base portion
181b, 182b Protruding portion
191 to 198 Wiring bonding wire
201 to 206, 501 to 504, 511, 512 Wire member
201a, 203a, 204a Wire portion
201b, 203b, 204b Bonding portion

The invention claimed is:

1. A semiconductor device, characterized by comprising:
a substrate;
an insulating substrate mounted on the substrate;
a metal layer formed on the insulating substrate;
an electronic part mounted on the metal layer across a bond; and
a wire member, separate from a wiring wire, which contains a material repellent to the bond and is formed on the metal layer and around the electronic part.

2. The semiconductor device according to claim 1, characterized in that
the wire member is disposed between the electronic part and an edge of the metal layer.

3. The semiconductor device according to claim 2, characterized in that
the wire member has a wire portion, and the wire portion extends along the edge of the metal layer.

4. The semiconductor device according to claim 2, characterized in that the wire member has a bonding portion, and a plurality of the bonding portions are disposed aligned along the edge of the metal layer.

5. The semiconductor device according to claim 2, characterized in that
the electronic part is an external connection terminal.

6. The semiconductor device according to claim 1, characterized in that
another electronic part is mounted on the metal layer across a bond, and
the wire member is disposed between the electronic part and the other electronic part.

7. The semiconductor device according to claim 6, characterized in that
the wire member has a wire portion, and the wire portion extends in a direction crossing the direction joining the electronic part and other electronic part.

8. The semiconductor device according to claim 6, characterized in that
the wire member has a bonding portion, and a plurality of the bonding portions are disposed aligned in a direction crossing the direction joining the electronic part and other electronic part.

9. The semiconductor device according to claim 6, characterized in that
the electronic part is an external connection terminal, and the other electronic part is a semiconductor element.

10. The semiconductor device according to claim 6, characterized in that
each of the electronic part and the other electronic part is a semiconductor element.

11. The semiconductor device according to claim 1, characterized in that
the bond is solder.

* * * * *